United States Patent [19]

Iwamura et al.

[11] Patent Number: 5,057,713
[45] Date of Patent: Oct. 15, 1991

[54] BIPOLAR MOS LOGIC CIRCUIT AND SEMICONDUCTOR INTEGRATED CIRCUIT

[75] Inventors: Masahiro Iwamura, Hitachi; Akira Ide, Takasaki, both of Japan

[73] Assignee: Hitachi, Ltd., Tokyo, Japan

[21] Appl. No.: 486,419

[22] Filed: Feb. 28, 1990

[30] Foreign Application Priority Data

Mar. 2, 1989 [JP] Japan ................................. 1-050540

[51] Int. Cl.5 ...................... H03K 19/20; H03K 17/16
[52] U.S. Cl. .................................... 307/446; 307/451; 307/542; 307/546; 307/296.3; 307/570
[58] Field of Search ............... 307/443, 446, 451, 542, 307/544, 546, 563, 296.3, 570

[56] References Cited

U.S. PATENT DOCUMENTS

| | | | |
|---|---|---|---|
| 4,558,234 | 12/1985 | Suzuki et al. | 307/446 |
| 4,616,146 | 10/1986 | Lee et al. | 307/446 |
| 4,638,186 | 1/1987 | McLaughlin | 307/446 |
| 4,769,561 | 9/1988 | Iwamura et al. | 307/446 |
| 4,799,014 | 10/1988 | Masmoka et al. | 307/446 |
| 4,813,020 | 3/1989 | Iwamura et al. | 307/446 |
| 4,871,928 | 10/1989 | Bushey | 307/570 |

Primary Examiner—Stanley D. Miller
Assistant Examiner—Margaret Rose Wambach
Attorney, Agent, or Firm—Antonelli, Terry, Stout & Kraus

[57] ABSTRACT

An invention is disclosed, which is suitable for operating a bipolar-MOS logic circuit, and in particular Bi-CMOS logic circuit with a low power supply voltage below 5V, e.g. around 3V. According to the present logic circuit, since the base current of a second NPN transistor is supplied from a power supply through a PMOS transistor (first current switching means), the impedance of which is lowered previously by a logic inverting means and an NMOS logic circuit (second current switching means), which is on/off controlled by an input signal, in a transient logic level transition period where the output is switched from the level "1" to "0" (i.e. it falls), it is possible to supply a sufficient base current to the second NPN. In this way, it is possible to turn-on the second NPN with a high speed and to pull down to the level "0" with high speed. Further, since the PMOS is switched off owing to the action of the logic inverting means just after having allowed a sufficient base current flow therethrough, the current path, through which the base current of the second NPN is supplied, is stopped and thus DC power consumption is elimated.

19 Claims, 8 Drawing Sheets

FIG. IA
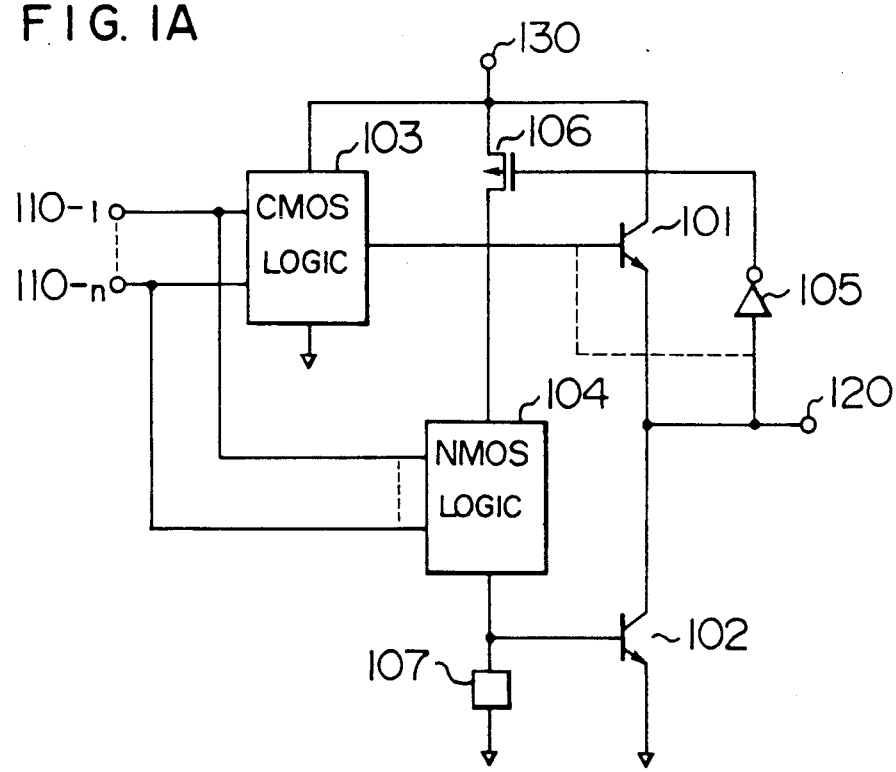
FIG. IB
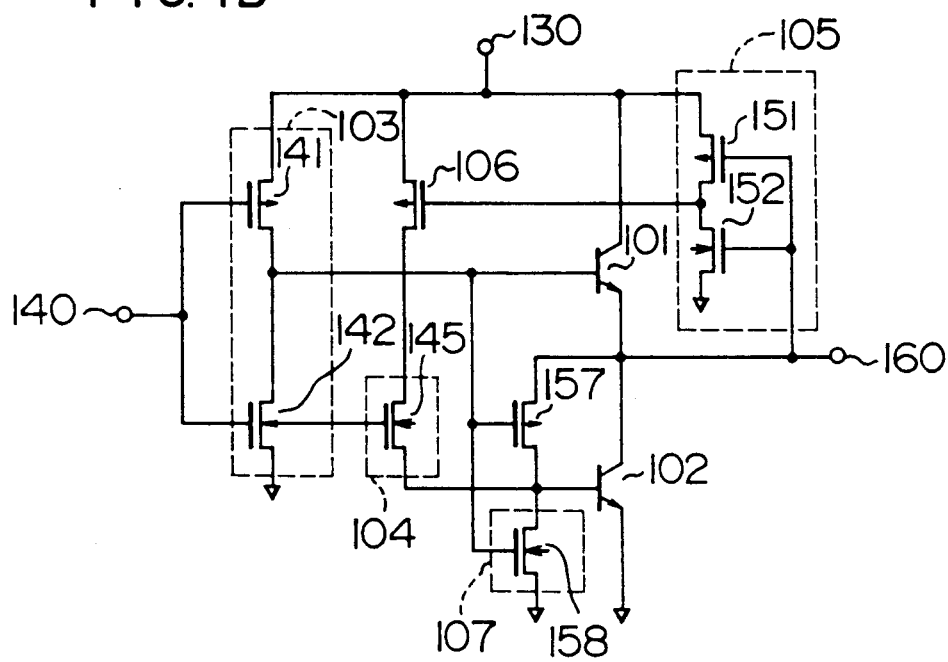
FIG. IC
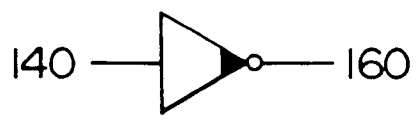

BIPOLAR MOS LOGIC CIRCUIT AND SEMICONDUCTOR INTEGRATED CIRCUIT

BACKGROUND OF THE INVENTION

The present invention relates to a bipolar MOS logic circuit, in which bipolar transistors are combined with MOS field effect transistors, and in particular to a static and a dynamic logic circuit as well as a semiconductor integrated circuit of bipolar CMOS (complementary MOS) type, which are suitable for a low voltage operation.

The so-called Bi-CMOS logic circuit, in which both bipolar transistors and CMOS transistors are used, is well known, such as in U.S. Pat. Nos. 4,588,234, 4,616,146, 4,638,186, 4,769,561, and 4,779,014.

FIG. 9A shows a Bi-CMOS logic circuit disclosed in U.S. Pat. No. 4,769,561 described above. Since this circuit has advantages of low input capacitance, high output driving power, low power consumption and high speed, it is widely utilized in logic integrated circuits (LSI) and memory LSIs. However, this circuit has a problem in that the advantage of high speed described above is quickly lost for a power supply voltage around 3 V, although the advantages described above can manifest themselves for a power supply voltage around 5 V. The deterioration in the speed accompanied by the decrease in the power supply voltage is produced principally as a result of a substantial increase in the delay time of the fall of the output signal, as indicated in FIG. 9B. FIG. 9C indicates the dependence of the delay time with the fall of the power supply voltage, in which the full line represents such a dependence on the power supply voltage for a CMOS logic circuit and the broken line the same for a Bi-CMOS logic circuit. As clearly seen from the figure, in a prior art Bi-CMOS logic circuit, the delay time increases quickly, when the power supply voltage is lowered to a value around 3.5 V, and the usefulness thereof as a high-speed operation logic is lost for a power supply voltage around 3 V.

The principal cause which lead to the deterioration in the speed include the following: the base current in NPN transistor 902 (FIG. 9A) decreases quickly as a result of a decrease in the amplitude of the input signal accompanied by the lowering in the power supply voltage, the rise in the source potential in N channel MOS transistor (hereinbelow called simply NMOS transistor) 905 due to the base-emitter voltage $V_{BE}$, which is peculiar to the Bi-CMOS circuit, the decrease in the source-drain voltage $V_{DS}$ in the NMOS 905, etc.

FIG. 10 shows a circuit disclosed in U.S. Pat. No. 4,558,234 stated above. In this circuit an NPN transistor (hereinbelow called simply NPN) 1001 is used for pulling up the output and an NMOS 1002 for pulling down the output. Since an NPN transistor is not used as the pulling down transistor in this circuit, a quick decrease in the speed is not produced even for a power supply voltage around 3 V. However, since an NMOS transistor is used as the pulling down (pull-down) transistor, in the case where a load having a large capacitance is driven, the delay time in the fall of the output is long. If it is attempted to increase the driving power by increasing the conductance of the NMOS transistor, the gate capacitance increases, which lowers the speed of the circuit in the preceding stage. Further, it has another drawback in that the effective load is increased by the drain junction capacitance itself.

FIG. 11 shows a circuit disclosed in U.S. Pat. No. 4,638,186, whose principal purpose is to reduce the delay of the fall in the Bi-CMOS logic circuit. This circuit is identical to that indicated in FIG. 9A, except that an NMOS transistor 1107 is added thereto, and works as an inverter circuit. The drain of an NMOS transistor 1107 is connected with the input terminal 1111, the gate is connected with the output terminal 1120 and the source is connected with the base of an NPN transistor 1102. Now a case where the input is changed from "0" to "1" is considered. The output 1120 is at first at the level "1" and the NMOS transistor 1107 is turned on. Consequently the base current flows from the input to the NPN transistor 1102 through the NMOS transistor 1107, which turns on the NPN transistor 1102. Since this base current has added to it a current from another NMOS transistor 1105, the resulting base current of the NPN transistor 1102 is increased, which has an effect of reducing the delay of the fall of the output. However, since this circuit is such that the base current of the NPN transistor 1102 flows from the input terminal 1111, it has a problem in that the input impedance is low, which leads to another problem that the load viewed from the driving circuit in the preceding stage is increased. Further, since the gate of the NMOS transistor 1107 is connected with the output terminal 1120, the drain current is lowered rapidly with the fall of the output and therefore the full extent of the result expected, cannot be manifested.

FIG. 12A shows a circuit disclosed in U.S. Pat. No. 4,716,310 for increasing the switching speed of the pulling down (pull-down) NPN transistor In this circuit an NPN $Q_1$ is driven by a PMOS transistor $Q_3$ and the pulling down transistor $Q_2$ is driven by NMOS transistor $Q_4$ and $Q_5$. The NMOS transistor $Q_4$ and $Q_5$ are connected in series between a power supply $V_H$ and the base of an NPN transistor $Q_2$, the gate of NMOS transistor $Q_4$ is connected with the input signal terminal IN and the gate of NMOS transistor $Q_5$ with the outPut signal terminal OUT.

One of the problems arising from such a circuit is that since there exists no means for discharging the base of transistor $Q_1$, an undesirable collector current (corresponding to the hatched part in the related waveform indicated by $I_{CI}$ in FIG. 12B) flows through the transistor $Q_1$, which should be originally turned off, at the fall of the output OUT and that in this way the falling speed of the output is lowered and at the same time power consumption is increased.

Another problem is that since the gate of the NMOS transistor $Q_5$ is connected with the output OUT, and noting that the transistors $Q_5$ and $Q_2$ are turned off when the "0" level $V_{OL}$ is lowered to $V_{OL} = V_L + V_{BE}(Q_2) + V_{TH}(Q_5)$, as indicated by the waveform OUT in FIG. 12B, the output is not lowered sufficiently to "0" and the level required as a logic circuit (for example, logic "0" level) cannot be secured.

Still other Bi-CMOS circuits, by which attempts to shorten the delay time in the fall, are disclosed in FIGS. 10 to 20 in U.S. Pat. No. 4,779,014. In FIG. 10 thereof, NMOS transistors 18, 19 and 20 constitute a pulling down base current supplying circuit, among which the NMOS transistors 18 and 20 are newly added, in order to increase the base current. This circuit, however, has following problems;

1) The number of NMOS logic elements employed between $V_{OUT}$ and the base of an NPN 15 is twice as many as that required in a prior art equivalent circuit. That is, 2N NMOS transistors are necessary for N input gates (N being an integer).

2) Since the NMOS transistor 18 is added, the circuit between $V_{OUT}$ and the NPN transistor 15 includes the NMOS transistors 18 and 19 connected in series and therefore the base current supplying power of the NPN 15 is reduced to about a half.

3) The control transistor 19 is an NMOS transistors. Consequently, the gate just before the fall of $V_{OUT}$ is at the level "1". At this time the source potential of the NMOS 19 is ($V_{OUT}$-$V_{th}$) and the NMOS 19 is in a high impedance state, which is close to that observed, when it is turned off.

For this reason, since no current can flow through the NMOS 19, unless the source potential is lowered to a value below ($V_{OUT}$- $V_{th}$), the supply of the base current passing from the power supply to NMOS 18 through NMOS 19 is delayed. Consequently, this circuit can contribute almost nothing to the shortening of the delay of the fall of the output $V_{OUT}$.

Further, since the bias between the gate and the source of the NMOS 19 becomes rapidly decreased together with the fall of the output $V_{OUT}$, there is a problem that the added base current is decreased rapidly and therefore no substantial improvement in the operation speed can be expected.

Now, in order to solve problems involving the lowering of the breakdown voltage of elements accompanied by the decrease in the size of semiconductor devices and the increase in the power consumption accompanied by the increase in the integration, the tendency of lowering the power supply voltage has become more and more inevitable. Therefore, a Bi-CMOS logic circuit capable of manifesting performance as high as that obtained heretofore even with a low power supply voltage is strongly desired.

As explained above, the prior art Bi-CMOS logic circuit has a problem in that it cannot be used as a high speed logic circuit of in connection with the development and demands of the next generation devices, because the switching speed is rapidly lowered, when the power supply voltage is lowered to a value around 3 V.

SUMMARY OF THE INVENTION

An object of the present invention is to provide a bipolar MOS logic circuit and a semiconductor integrated circuit capable of securing a high speed operation even at a low power supply voltage.

Another object of the present invention is to provide various types of logic circuits such as a static logic circuit, a dynamic logic circuit and a wired logic circuit.

In order to achieve the above objects, a bipolar-MOS logic circuit according to the present invention comprises a first NPN transistor having a collector connected to receive a first potential power supply potential and an emitter connected with an output terminal; a second NPN transistor having a collector connected with the output terminal and an emitter connected to receive a second potential, such as a reference potential; logic inverting means having an input terminal connected with the emitter or the base of the first NPN transistor for performing a logic inversion; a CMOS logic circuit having an output connected to the base of the first NPN transistor and a gate to which an input signal is applied; a P channel MOS transistor having a source connected to receive the first potential terminal and a gate connected to the output of the logic inverting means; and an NMOS logic circuit connected between the drain of the P channel MOS transistor and the base of the second NPN transistor, the NMOS logic circuit including a MOS transistor having a gate to which the input signal is applied. Preferably, it comprises further discharging means connected between the base of the second NPN transistor and a terminal for receiving the second potential.

Further, both the CMOS logic circuit and the NMOS logic circuit are preferably logic circuits having the same logic function with k inputs (k≧1).

A bipolar-MOS logic circuit according to another aspect of the present invention comprises a first NPN transistor having a collector connected to a terminal for receiving a first potential, such as a power supply potential, and an emitter connected to an output terminal; a second NPN transistor having a collector connected to the output terminal and an emitter connected to a terminal for receiving a second potential, such as a reference potential; a CMOS logic circuit supplying an output which is at a level "0" or a level "1", to the base of the first NPN transistor in response to k input signals (k≧1) applied thereto; first current switching means connected to the first potential terminal, which is rendered conductive when the output of the CMOS logic circuit is at the level "1" and cut off when it is at the level "0"; and second current switching means connected in series with the first current switching means, which is rendered cut off when the output of the CMOS logic circuit is at the level "1" and conductive when it is at the level "0"; a base current being supplied from the second current switching means to the second NPN transistor.

Either one of the bipolar-MOS logic circuits described above may comprise a PMOS transistor having a source connected to the output terminal, a gate connected to the output of the CMOS logic circuit and a drain connected to the base of the second NPN transistor.

It is also possible to realize a wired logic function by providing a plurality of bipolar-MOS logic circuits as described above, whose outputs are connected in common. In a bipolar-MOS logic circuit by which the wired logic function is realized, at least one of the plurality of logic circuits may comprise a further logic inverting means having an input terminal connected to the output of the logic inverting means described above and an output connected with the input of the same.

A bipolar-MOS logic circuit according to another aspect of the present invention comprises a CMOS logic circuit receiving an input signal; a bipolar transistor circuit including a first and a second NPN transistor connected in series between a first potential terminal, such as for receiving a power supply potential and a second potential terminal such as a for a reference potential and generating an output at the connecting point between the emitter of the first NPN transistor and the collector of the second NPN transistor, the bipolar transistor circuit being coupled to receive an output of the CMOS logic circuit described above; and means for establishing a current path including a PMOS switch and an NMOS switch connected in series from the first potential terminal to the base of the second NPN transistor only in a transient state in which the output of the bipolar transistor circuit changes from the level "1" to "0".

A bipolar-MOS logic circuit according to another aspect of the present invention is a so-called dynamic logic circuit, which comprises an NPN transistor having a collector connected to an output bus and an emitter connected to a reference potential terminal; logic inverting means having its input connected to the collector of the NPN transistor; a P channel MOS transistor having a source connected to a first potential terminal, such as for receiving a power supply terminal and a gate connected to the output of the logic inverting means; an NMOS logic circuit connected between the drain of the P channel MOS transistor and the base of the NPN transistor and having k inputs (k≧1), to which an input signal is applied; and discharging means connected between the base of the NPN transistor and the reference (second) potential terminal. This bipolar-MOS logic circuit may comprise further another logic circuit having its input connected to the output of the logic inverting means and its output connected to the input of the same. Further, in the dynamic bipolar-MOS logic circuit stated above, the discharging means can be constituted by an N channel MOS transistor having a drain connected to the base of the NPN transistor, a gate connected to the collector of the NPN transistor, and a source connected to the reference or second potential terminal.

A bipolar-MOS logic circuit according to an aspect of the present invention as a dynamic logic circuit comprises an NPN transistor having a collector connected to an output bus and an emitter connected to a reference potential terminal; a PMOS transistor, one end of the channel of which is connected to a first potential terminal, such as for receiving a power supply potential, and which is turned on when the output bus stated above is at a level "1" and turned off when it is at a level "0"; and an NMOS logic circuit having k inputs (k≧1), one end of the channel of which is connected to the other end of the PMOS transistor and to the gate of which an input signal is applied; the other end of the channel of the NMOS logic circuit being connected to the base of the NPN transistor.

A bipolar-CMOS semiconductor integrated circuit according to another aspect of the present invention has k input terminals (k≧1), a first potential terminal, such as for receiving a power supply potential terminal, a reference second potential terminal such as a for a potential, and an output terminal, and comprises a first NPN transistor having a collector connected to the first potential terminal and an emitter connected to the output terminal; a second NPN transistor having a collector connected to the output terminal and an emitter connected to the second potential terminal; a CMOS logic circuit connected to the k input terminals and having its output connected to the base of the first NPN transistor; and means for establishing a current path from the power supply terminal to the base of the second NPN transistor only in a logic level transition state in which an output at the output terminal changes from a level "1" to another level "0".

A bipolar-CMOS semiconductor integrated circuit according to another aspect of the present invention has k input terminals (k≧1), a power supply terminal, a reference potential terminal and an output terminal, and comprises a CMOS logic circuit connected to the k input terminals; a bipolar transistor circuit having a first and a second NPN transistor connected in series between the first potential terminal and the second potential terminal and generating an output at the connecting point between the two bipolar transistors, receiving an output of the CMOS logic circuit; and means for establishing a current path including a PMOS switch and an NMOS switch connected in series from the first potential terminal to the base of the second NPN transistor only in a transition state in which an output at the output of the bipolar transistor circuit changes from a level "1" to another level "0"; whereby no significant deterioration in the fall characteristics of the output at the output terminal occurs, even if the power supply voltage applied to the power supply terminal decreases to a value around 3 volt.

As described above, in the case where it is supposed that a bipolar-MOS logic circuit, in particular a Bi-CMOS logic circuit is driven with a power supply voltage around 3 V, the delay of the rise of the prior art Bi-CMOS logic circuit does not raise any serious problem, but a problem arises in that the delay of the fall rapidly increases. Consequently, in the present invention, it is intended particularly to shorten the delay time in the fall for a low power supply voltage.

According to the Bi-CMOS logic circuit described above, since the base current of the second NPN transistor is supplied from, for example, the power supply through a PMOS transistor (i.e., first current switching means), the impedance of which is first lowered by the logic inverting means and an NMOS logic circuit (i.e., second current switching means), which is on/off controlled by an input signal, in a transient period where the output is switched from a level "1" to another level "0" (i.e. it falls), it is possible to supply sufficient base current to the second NPN transistor. In this way, it is possible to turn-on the second NPN transistor at a high speed and to switch-off the output to the level "0" at a high speed. Further, since the PMOS transistor is switched off owing to the action of the logic inverting means just after having established sufficient base current flow therethrough, the current path through which the base current of the second NPN transistor is supplied, is stopped and thus power consumption is reduced. Furthermore, owing to these characteristics, it is possible to realize a wired logic function by connecting outputs of a plurality of bipolar-MOS logic circuits with each other.

Still further, the present invention can be suitably applied to a so-called dynamic logic circuit having only the function of changing the output to the level "0".

BRIEF DESCRIPTION OF THE DRAWINGS

FIG. 1A is a block diagram showing a first embodiment of the present invention;

FIGS. 1B and 1C are a circuit diagram and a diagram showing the logic symbol respectively, of a second embodiment of the present invention;

DESCRIPTION OF THE PREFERRED EMBODIMENTS

Figure 2A:
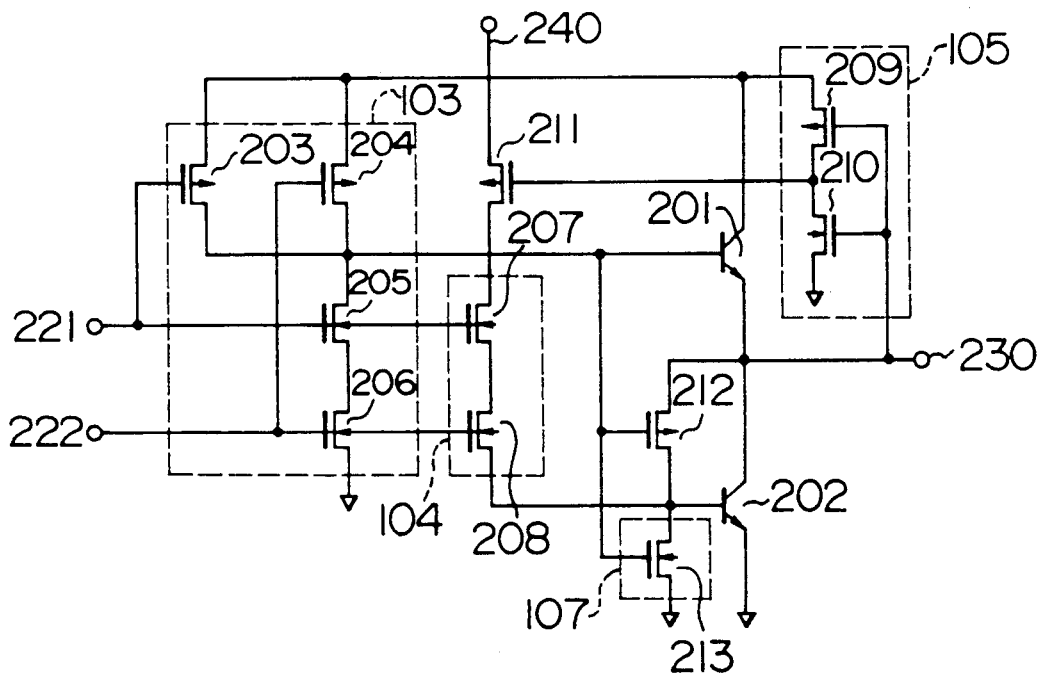
FIGS. 2A and 2B are a circuit diagram and a diagram showing the logic symbol, respectively, of a third embodiment of the present invention.

FIG. 1A shows the first embodiment of the present invention. For simplicity, an NPN transistor, PNP transistor, P-channel MOS transistor and N-channel MOS transistor are abbreviated as NPN, PNP, PMOS and NMOS, respectively.

In the Figure, a reference numeral 101 is a first NPN having its collector and its emitter connected to a power supply terminal 130 and an output terminal 120, respectively; 102 is a second NPN, having its collector and its emitter connected to the output terminal 120 and a reference potential (terminals), respectively; 103 is a CMOS logic circuit having its gate connected with input signals (110-1 to 110-n) and its output connected with the base of the NPN 1011; 104 is an NMOS logic circuit having its gate connected with the input signals, in which the end of the channel is connected with the drain of a PMOS 106, and the other end thereof is connected with the base of the second NPN 102; 105 is an inverter circuit (logic inverting means) having its input connected with the output terminal 120 and its output connected with the gate of the PMOS 106; 106 is a PMOS having its source connected with the power supply terminal 130; and 107 is a discharging means connected between the base of the second NPN transistor 102 and the reference potential for discharging the base charge. Further, the input of the inverter 105, alternatively, may be connected with the base of the NPN 101 instead of with the output terminal 120, as shown by the dashed line in FIG. 1A. This is true similarly for the succeeding embodiments.

Hereinbelow, the operation of the embodiment indicated in Fig 1A will be explained. At first, the operation will be explained of the case where the output of the CMOS logic circuit 103 is switched over from the level "0" to "1".

This operation occurs, when the output of the CMOS logic circuit 103 is changed from the level "0" to "0". The NMOS logic circuit 104 is configured so as to be switched off at this time. Consequently, the NPN 102 is turned off. On the other hand, since the base potential of the NPN transistor 101 is switched from the level "0" to "1", the NPN transistor 101 is turned on. As a result, the output 120 is switched from the level "0" to "1". In response thereto, the output of the inverter 105 is switched from the level "1" to "0" and the PMOS 106 is turned on so as to be in the low impedance state. That is, the drain voltage is equal to the potential of the power supply 130. At this time, since the NMOS logic circuit 104 is switched off as described previously, no current flows from the PMOS 106 to the NMOS logic circuit 104.

Next, when the input signal is changed and the output of the CMOS logic circuit 103 is switched from the level "1" to "0", the NPN 101 is turned off. On the other hand, the NMOS logic 104 is turned on and the base current flows from the power source 103 to the NPN 102 through the PMOS 106 having a low impedance and the NMOS logic circuit 104. As a result, the NPN 102 is turned on and the output 120 is switched from the level "1" to "0". In this switching process, the PMOS transistor 106 is kept to be in the low impedance state and the NPN 102 continues to make a base current flow, whose intensity is necessary and sufficient for switching the output 120 to the level "0". When the output 120 is switched to the level "0", the output of the inverter 105 is switched from the level "0" to "1" to turn off the PMOS transistor 106. As a result, the base current from the power supply 130 to the NPN 102 is stopped.

Since this Bi-CMOS logic circuit is so constructed that the base current is supplied to the NPN transistor 102 through the PMOS switch 106 and the NMOS logic circuit 104 connected in series between the power supply 130 and the base of the second NPN 102 so that the PMOS 106 and the NMOS logic circuit 104 can be driven in a state in which the voltage applied to the PMOS 106 and the NMOS logic circuit 104 is high (power source voltage $-V_{BE}$), it is possible to supply a larger base current to the NPN 102. Further, since the PMOS 106 continues to hold the low impedance in the switching process of the output from the level "1" to "0" owing to the action of the logic inverting means 105, it is possible to continue to make the base current necessary for switching the NPN 102 flow therethrough. Consequently, the rapid lowering in the speed accompanied by the lowering in the power supply voltage is relieved considerably with respect to that observed by the prior art techniques.

Hereinbelow, several embodiments further to the embodiment indicated in FIG. 1A will be explained more in detail.

FIGS. 1B and 1C show the second embodiment of the present invention.

In FIG. 1B, reference numerals 101, 102 and 106 are the NPN, the NPN and the PMOS, respectively, connected similarly to those indicated in FIG. 1A. 141 is a PMOS having the drain connected with the power supply 130 and the gate connected with the input signal 140 and 142 is an NMOS having the drain connected with the drain of the PMOS 141, the source connected with the reference potential and the gate connected with the input signal 140. In the present embodiment the PMOS 141 and the NMOS 142 constitute the CMOS logic circuit 103. Further, a numeral 145 is an NMOS having the drain connected with the drain of the PMOS 106, the source connected with the base of the NPN 102 and the gate connected with the input signal 140, in the present embodiment the NMOS 145 constituting the NMOS logic circuit 104. 158 is an NMOS having the drain connected with the base of the NPN 102, the gate connected with the base of the NPN 101 and the source connected with the reference potential, the NMOS 158 serving as discharging means 107 discharging the base of the NPN 102. However it is not restricted thereto. 157 is a PMOS having the source connected with the output 160, the drain connected with the base of the NPN 102 and the gate connected with the base of the NPN 101. Although this PMOS is not always necessary and not indicated in FIG. 1A, it has an advantage of cancelling noise, etc. in the output and stabilizing the output 160, when the output 160 is at the level "0". Further, when the output 160 is switched from the level "1" to "0", it contributes to the shortening of the fall time of the output 230 by supplying the base current to the NPN 102.

The function of the circuit indicated in FIG. 1B is an inverter, as indicated by a logic symbol in FIG. 1C. The operation thereof is as follows.

Now, it is supposed that the input signal 140 is switched from the state of the level "1" to "0". At this time, the PMOS 141 is turned on and the NMOS 142 is turned off. Further the NMOS 145 is turned off. Consequently, the base of the NPN 101 is switched over from the level "0" to "1". As a result, the PMOS 157 is turned off and thus the NPN 102 is turned off. Further, due to the fact that the base of the NPN 101 has been switched to the level "1", the NPN 101 is turned on and the output 160 is switched to the level "1". At this time, the output of the inverter 105 including the PMOS 151 and the NMOS 152 is switched to the level "0" and turns-on the PMOS 106.

Next, starting from this state, a case where the input signal 140 is switched from the level "0" to "1" is considered. At this time, the PMOS 141 is turned off and the NMOSs 142 and 145 are turned on. In addition, the NMOS 158 is turned off and the PMOS 157 is turned on. At this time, a base current flows from the power supply 130 to the NPN 102 through the PMOS 106 (held still in the ON state) and the NMOS 145. On the other hand, due to the fact that the PMOS 157 has been turned on, the base current of the NPN 102 is supplied from the output 160 through the PMOS 157. Consequently, both the currents are added so that sufficient base current is supplied to the NPN 102. In this way, it is possible to switch the output 160 from the level "1" to "0" at a high speed. When the output 160 is switched from the level "1" to "0", the output of the inverter 105 is switched from the level "0" to "1" and turns-off the PMOS 106. As a result, the base current from the power supply 130 to the NPN 202 is stopped.

Figure 2B:

FIGS. 2A and 2B show a third embodiment of the present invention.

In FIG. 2A, reference numeral 201 is an NPN having the collector and the emitter connected with the power supply 240 and the output 230, respectively; 202 is an NPN having the collector and the emitter connected with the output 230 and the reference potential; and 203 and 204 are PMOSs having the drains connected in common with the base of the NPN 201, the gates connected with the input signals 221 and 222 and the sources connected with the power supply 240. Further 205 and 206 are NMOSs connected in series between the drains of the PMOSs 203 and 204 and the reference potential and having the gates connected with the input signals 221 and 222, respectively. The PMOSs 203 and 204 and the NMOSs 205 and 206 constitute the CMOS logic circuit 103. 207 and 208 are NMOSs connected in series between the drain of the PMOS 211 and the base of the NPN 202 and having the gates connected with the input signals 221 and 222, respectively, which NMOSs constitute the NMOS logic circuit 104.

The PMOS 209 and the NMOS 210 having the gates connected with the output 230 constitute the well known CMOS inverter 105 and the output of the inverter from the common connection points of the drains thereof is connected with the gate of the PMOS 211.

A numeral 212 denotes a PMOS having the source connected with the output 230, the gate connected with the base of the NPN 201 and the drain connected with the base of the NPN 202. A numeral 213 denotes an NMOS having the drain connected with the base of the NPN 202, the gate connected with the base of the NPN 201 and the source connected with the reference potential, which NMOS is disposed as discharging means 107 discharging the base of the NPN 202. However, the discharging means is not restricted specifically thereto.

The function of the present circuit is an NAND gate having two inputs, as indicated by a logic symbol in FIG. 2B, and the operation thereof is as follows.

Now, it is supposed that at least one of the input signals 221 and 222 is switched from a state where both are at the level "1" to "0". At this time, at least one of the PMOSs 203 and 204 is turned on and at least one of the NMOSs 205 and 206 is turned off. Further at least one of the NMOSs 207 and 208 is turned off.

Consequently, the base of the NPN 201 is switched from the level "0" to "1". As a result, the PMOS 212 is turned off and the NPN 202 is also turned off. Further, due to the fact that the base of the NPN 201 is switched to the level "1" the NPN 201 is turned on and the output 230 is switched to the level "1". At this time, the output of the inverter 105 including the PMOS 209 and the NMOS 210 is switched to the level "0" to turn-on the PMOS 211.

Now, a case where both the input signals 221 and 222 are switched from this state to the level "1" is considered. At this time, both the PMOSs 203 and 204 are turned off and all of the NMOSs 205 and 206 as well as the NMOSs 207 and 208 are turned on. Consequently, the base of the NPN 201 is switched from the level "1" to "0" so that the NMOS 213 is turned off, while the PMOS 212 is turned on. At this time, a base current flows from the power supply 240 to the NPN 202 through the PMOS 211 and the NMOSs 207 and 208. On the other hand, due to the fact that the PMOS 212 has been turned on, a base current is supplied from the output 230 to the NPN 202 through the PMOS 212. In this way, the two currents are added to each other and a larger base current flows through the NPN 202. For this reason, it is possible to switch the output 230 of the PNP 202 from the level "1" to "0" at a high speed. When the output 230 is switched from the level "1" to "0", the output of the inverter 105 is switched from the level "0" to "1" to turn-off the PMOS 211. As a result, the base current from the power supply to the NPN 202 is stopped.

Figure 3A:
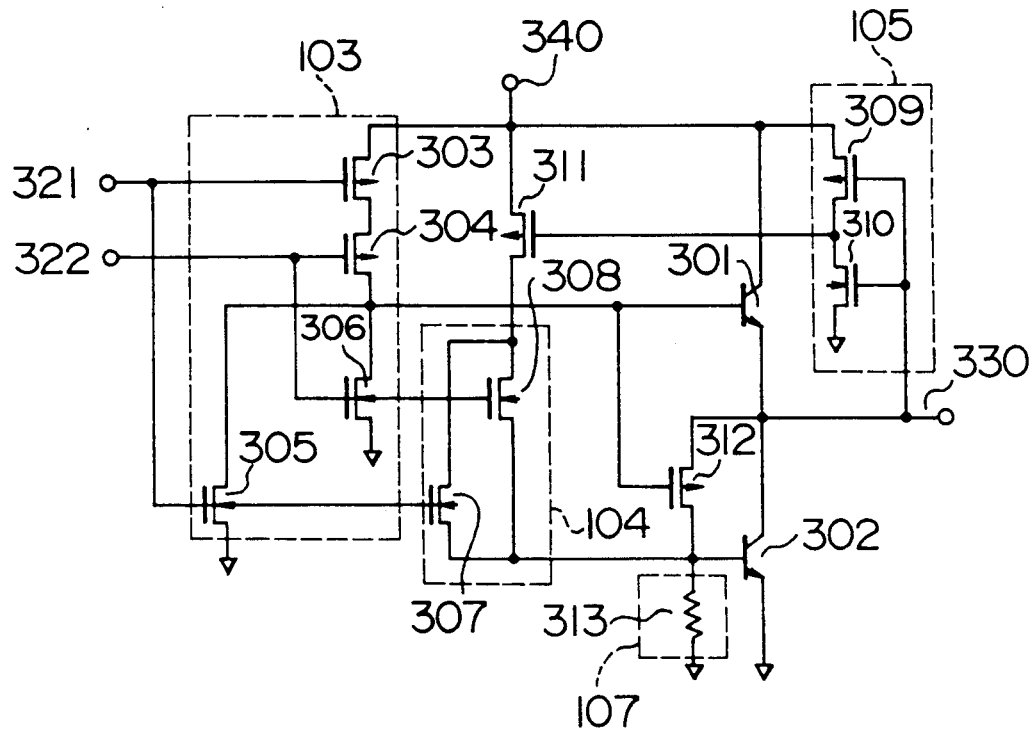
FIGS. 3A and 3B are a circuit diagram and a diagram showing the logic symbol, respectively, of a fourth embodiment of the present invention.
Figure 3B:

FIGS. 3A and 3B show the fourth embodiment of the present invention.

In FIG. 3A, a reference numeral 301 denotes an NPN having the collector and the emitter connected with the power supply 340 and the output 330, respectively; and 302 denotes an NPN having the collector and the emitter connected with the output 330 and the reference potential, respectively. 303 and 304 denote PMOSs connected in series between the power supply 340 and the base of NPN 301 and the gates thereof are connected with input signals 321 and 322, respectively. Numerals 305 and 306 denote NMOSs connected in parallel between the base of the NPN 301 and the reference potential and the gates thereof are connected with the input signals 321 and 322, respectively. The PMOSs 303 and 304 as well as the NMOSs 305 and 306 constitute the CMOS logic circuit 103. Numerals 307 and 308 denote NMOSs connected in parallel between the drain of a PMOS 311 and the base of the NPN 302 and the gates thereof are connected with the input signals 321 and 322, respectively, so as to constitute the NMOS logic circuit 104. A PMOS 309 and an NMOS 310 constitute the well known CMOS inverter 105, whose input is connected with the output 330 and whose output is connected with the gate of the PMOS 311.

A numeral 312 denotes a PMOS having the source connected with the output 330, the gate connected with the base of the NPN 301 and the drain connected with the base of the NPN 302. Further, a numeral 313 denotes a resistor connected between the base of the NPN 302 and the reference potential, which resistor 313 is provided as discharging means 107 for discharging the base change of the NPN 302. However, the discharging means 107 is not restricted specifically thereto.

The function of this circuit is a two-input NOR gate, as indicated by a logic symbol in FIG. 3B, and the operation thereof is as follows.

Now, it is supposed that at least one of the input signals 321 and 322 is switched from a state where both are at the level "0" to "1". At this time, at least one of the PMOSs 303 and 304 is turned off and at least one of the NMOSs 305 and 306 is turned on. Further, at least one of the NMOSs 307 and 308 is also turned on. Consequently, the base of the NPN 301 is switched from the level "1" to "0". As a result, the PMOS 312 is turned on. At this time, a sufficient base current flows from the power supply 340 to the NPN 302 through the PMOS 311 and at least one of the NMOSs 307 and 308. Further, a base current flows also from the output 330 to the NPN 302 through the PMOS 312 and thus, the NPN 302 is turned on to switch the output 330 from the level "1" to "0" at a high speed. In response to such change, the output of the inverter 105 including the PMOS 309 and the NMOS 310 is switched to the level "1" to turn-off the PMOS 311.

Next, a case where both the inputs 321 and 322 are switched from this state so as to be at the level "0" is considered. At this time, both the PMOSs 303 and 304 are turned on and all of the NMOSs 305, 306, 307 and 308 are turned off. As a result, the base of the NPN 301 is switched from the level "0" to "1" so that the PMOS 312 is turned off and the NPN 302 is also turned off. On the other hand, due to the fact that the base potential has been switched to the level "1", the NPN 301 is turned on to switch the output 330 from the level "0" to "1". In response to such switching of the output signal, the output of the inverter including the PMOS 309 and the NMOS 310 is switched from the level "1" to "0" to turn-on the PMOS 311.

Figure 4A:
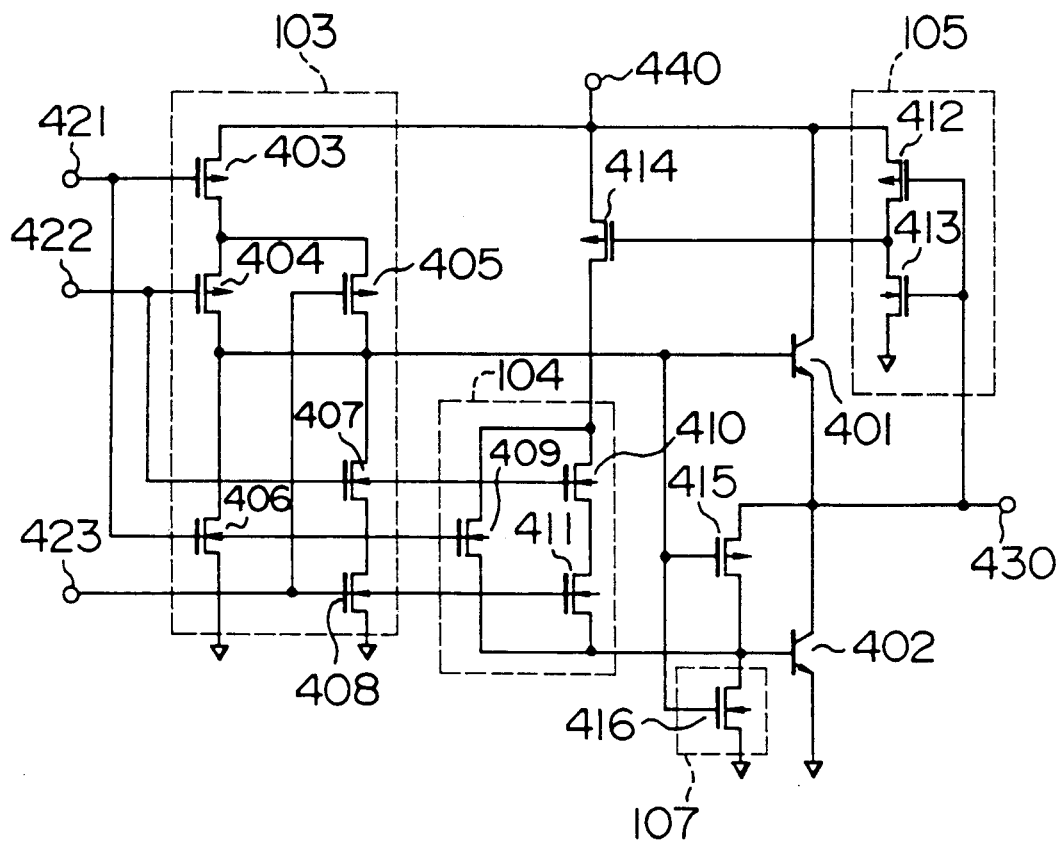
FIGS. 4A and 4B are a circuit diagram and a diagram showing the logic symbol, respectively, of a fifth embodiment of the present invention.
Figure 4B:
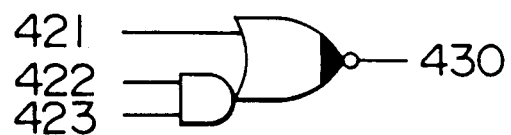

FIGS. 4A and 4B show the fifth embodiment of the present invention.

In FIG. 4A, a reference numeral 401 denotes an NPN having the collector and the emitter connected with the power supply 440 and the output 430, respectively; and 402 denotes an NPN having the collector and the emitter connected with the output 430 and the reference potential (terminal), respectively. Further, a numeral 403 denotes a PMOS having the source connected with the power supply 440, the gate connected with an input signal 421 and the drain connected with the sources of PMOSs 404 and 405. The drains of the PMOSs 404 and 405 are connected in common with the base of the NPN 401 and the gates thereof are connected with input signals 422 and 423. A reference numeral 406 denotes an NMOS having the drain connected with the base of the NPN 401, the gate connected with the input signal 421 and the source connected with the reference potential. Numerals 407 and 408 denote NMOSs connected in series between the base of the NPN 401 and the reference potential and the gates thereof are connected with the input signals 422 and 423, respectively. Further, the PMOSs 403, 404 and 405 as well as the NMOSs 406, 407 and 408 constitute the CMOS logic circuit 103. 409 is an NMOS having the drain connected with the drain of a PMOS 414, the gate connected with the input signal 421 and the source connected with the base of the NPN 402.

410 and 411 are NMOSs connected in series between the PMOS 414 and the base of the NPN 402 and the gates thereof are connected with the input signals terminals 422 and 423, respectively. Further, the NMOSs, 409, 410 and 411 constitute the NMOS logic circuit 104. A PMOS 412 and an NMOS 413 constitute the well known CMOS inverter 105, whose input is connected with the output 430 and whose output is connected with the gate of the PMOS 414. A numeral 415 denotes a PMOS having the source connected with the output 430, the gate connected with the base of the NPN 401 and the drain connected with the base of the NPN 402. A reference numeral 416 denotes an NMOS having the drain connected with the base of the NPN 402, the gate connected with the base of the NPN 401 and the source connected with the reference potential, which NMOS is provided as the discharging means 107 for discharging the base charge of the NPN 402.

The function of this circuit is a three-input AND-OR inverter, as indicated by a logic symbol in FIG. 4B and the operation thereof is as follows.

Now, it is supposed that the input signal 421 is at the level "0" and that the input signals 422 and 423 are switched from a state in which at least one of them is at the level "0" to another state in which both of them are at the level "1". Both the PMOSs 404 and 405 are turned off and the NMOSs 407 and 408 are turned on. Further, the NMOSs 410 and 411 are also turned on. Consequently, the base of the NPN 401 is switched from the level "1" to "0". As a result, the NPN 401 is turned off, the PMOS 415 is turned on, and the NMOS 416 is turned off. At this time, a sufficient base current flows from the power supply 440 to the NPN 402 through the PMOS 414 as well as the NMOS 410 and 411. Further, a base current flows also from the output 430 to the NPN 402 through the PMOS 415 so that the NPN 402 is turned on and the output 430 is switched rapidly from the level "1" to "0". In response to such a change, the output of the inverter 105 including the PMOS 412 and the NMOS 413 is switched to the level "1" to turn-off the PMOS 414.

Next, a case where at least one of the input signals 422 and 423 is switched from this state to the level "0" is considered. At this time, the PMOS 403 remains to be turned on and at least one of the PMOSs 404 and 405 is turned on. On the other hand, the NMOS 406 remains to be turned off and at least one of the NMOSs 407 and 408 is turned off. Further, at least one of the NMOSs 410 and 411 is also turned off. As a result, the base of the NPN 401 is switched from the level "0" to "1". In this way, the PMOS 415 is turned off, the NMOS 416 is turned on, and the NPN 402 is turned off. On the other hand, since the NPN 401 is turned on, the output 430 is switched from the level "0" to "1". In response to this switching of the output signal, the output of the inverter 105 including the PMOS 412 and the NMOS 413 is switched to the level "0" to turn-on the PMOS 414.

Figure 5A:
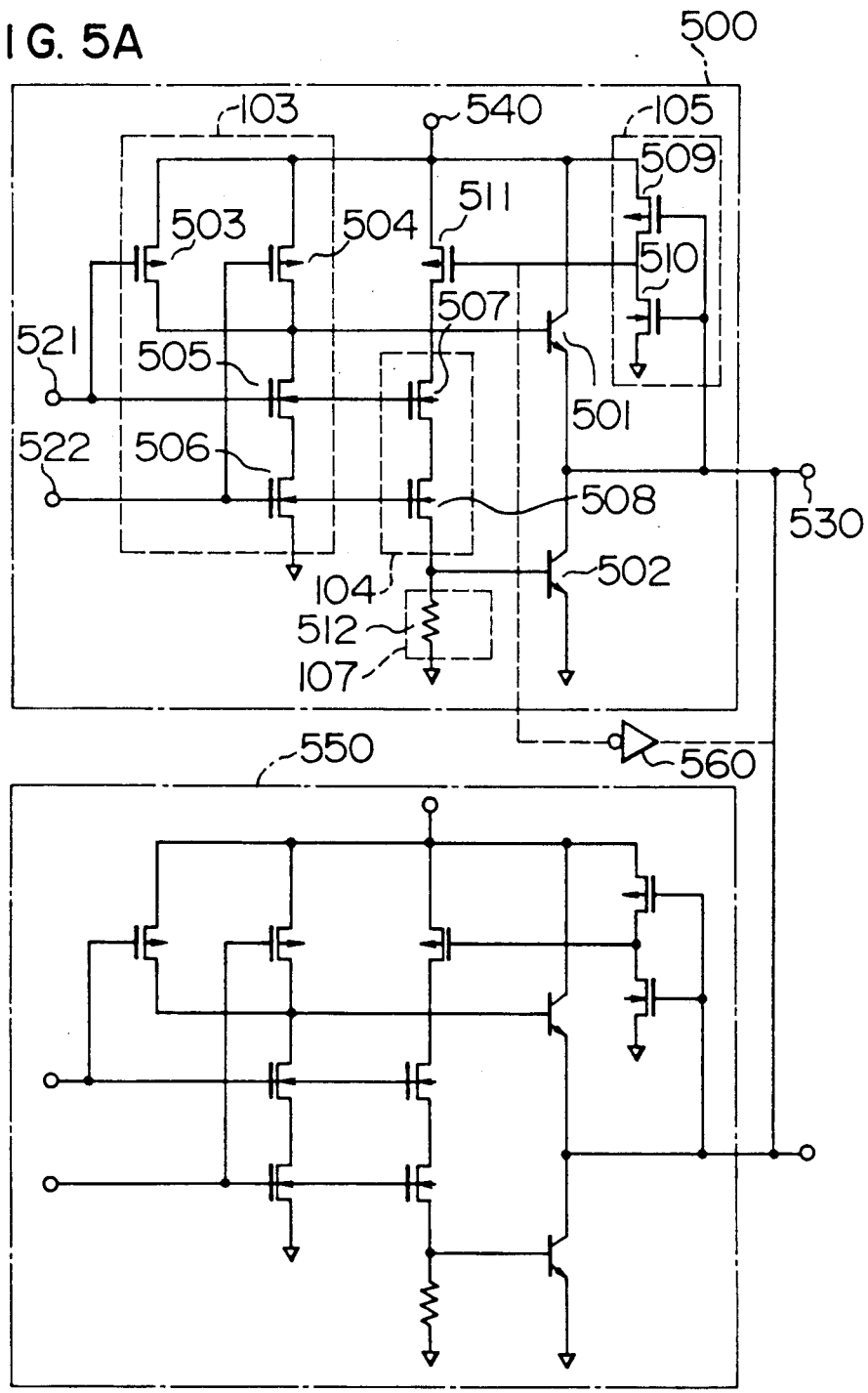
FIGS. 5A and 5B are a circuit diagram and a diagram showing the logic symbol, respectively, of a sixth embodiment of the present invention.
Figure 5B:
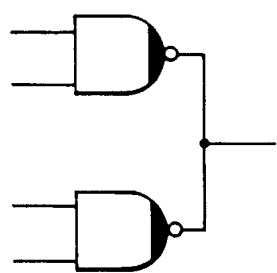

FIGS. 5A and 5B show the sixth embodiment of the present invention.

In FIG. 5A, a reference numeral 500 is a first two-input NAND gate and 550 is a second two-input NAND gate. Since the present embodiment represents a case where the gates 500 and 550 are the same two-input NAND gates, explanation of the structure and the operation of the gate 550 will be omitted.

In the two-input NAND gate 500, a numeral 501 denotes an NPN having the collector and the emitter connected with the power supply 540 and the output 530; and 502 denotes an NPN having the collector and the emitter connected with the output 530 and the reference potential, respectively. Numerals 503 and 504 denote PMOSs having the drains connected with the base of the NPN 501, the gates connected with the input signals 521 and 522, respectively, and the sources connected with the power supply 540. Further, numerals 505 and 506 denote NMOSs connected in series between the drains of the PMOSs 503 and 504 and the reference potential and the gates thereof are connected with the input signals 521 and 522, respectively. Still further, the PMOSs 503 and 504 as well as the NMOSs 505 and 506 constitute the NMOS logic circuit 103. Numerals 507 and 508 denote NMOSs connected in series between the drain of a PMOS 511 and the base of the NPN 502 and the gates thereof are connected with the input signals 521 and 522, respectively, and thus they constitute the NMOS logic circuit 104.

A PMOS 509 and an NMOS 510 having gates connected with the output 530 constitute the well known CMOS inverter 105 and the output of the inverter 105, which is the drains thereof connected in common, is connected with the gate of the PMOS 511. A numeral 512 denotes a resistor connected between the base of the NPN 502 and the reference potential, which resistor is provided as discharging means 107 for discharging the base charge of the NPN 502. Since this circuit serves as the same two-input NAND gate as that described in the embodiment explained, referring to FIGS. 2A and 2B, explanation of the operation thereof will be omitted.

In the present embodiment indicated in FIG. 5A, the wired logic function indicated in FIG. 5B is realized by connecting the outputs of the first two-input NAND gate 500 and the second two-input NAND gate 550 with each other at the output terminal 530 in common. It is due to the fact that no base current flows through the NPN 502 for the pull-down, because the PMOS 511 is turned off after the outputs of the two-input NAND gates 500 and 550 have been switched to the level "0", that such a logic function can be realized. Further, a numeral 560 denotes a CMOS inverter, whose input is connected with the output of the inverter 105 consisting of the PMOS 509 and the NMOS 510 and whose output is connected with the output terminal 530, which inverter has a function of equalizing the level "1" at the output terminal to the level of the power supply and the level "0" to the level of the reference potential. This circuit is added as needed.

Figure 6:
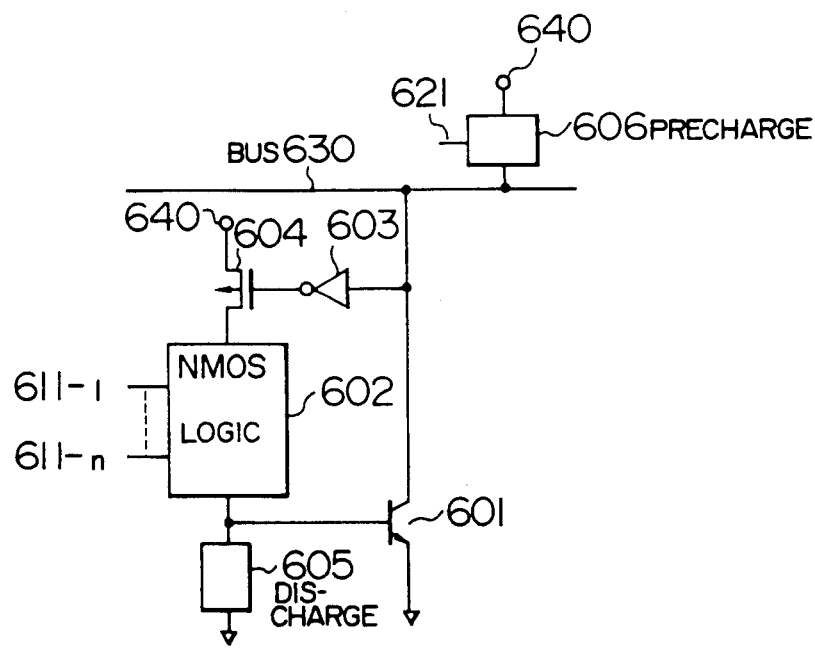
FIG. 6 is a circuit block diagram of a seventh embodiment of the present invention.

FIG. 6 shows the seventh embodiment of the present invention.

In the Figure, a reference numeral 601 denotes an NPN having the collector and the emitter connected with a bus 630 and the reference potential respectively; and 602 is a logic circuit including a plurality of NMOSs connected between the drain of a PMOS 604 and the base of the NPN 601, the gates of these NMOSs being connected with input signals 611-1 to 611-n. 603 is an inverter, whose input is connected with the collector of the NPN 601 and whose output is connected with the gate of the PMOS 604. A numeral 604 denotes a PMOS having the source connected with the power supply 640. Numeral 605 denotes discharging means connected between the base of the NPN 601 and the reference potential. Further, a numeral 606 denotes a precharging means connected between the power supply 640 and the bus 630, which is activated by a control signal 621 to precharge the bus 630 to the level "1". The circuit thus constructed in the present embodiment is a Bi-CMOS dynamic circuit and the operation thereof is as follows.

Now, a state where the bus 630 is precharged to the level "1" is considered. At this time, the output of the inverter 603 is at the level "0" and the PMOS 604 is turned on. In this state, if the logic of the NMOS logic circuit is made valid, in response to the input signals 611-1 to 611-n, a sufficient base current flows from the power supply 640 to the NPN 601 through the PMOS 604 and the NMOS logic circuit 602 to turn-on the NPN 601 so that the level of the bus 630 is switched rapidly from the level "1" to "0". On the other hand, in the case where the logic of the NMOS logic circuit 602 is not established, since no base current flows to the NPN 601, it is turned off and the bus 630 remains to be at the level "1". When the bus 630 is switched to the level "0", the output of the inverter 603 is switched to the level "1" so that the PMOS 604 is turned off. In this way, the base current flowing to the NPN 601 is stopped.

Figure 7:
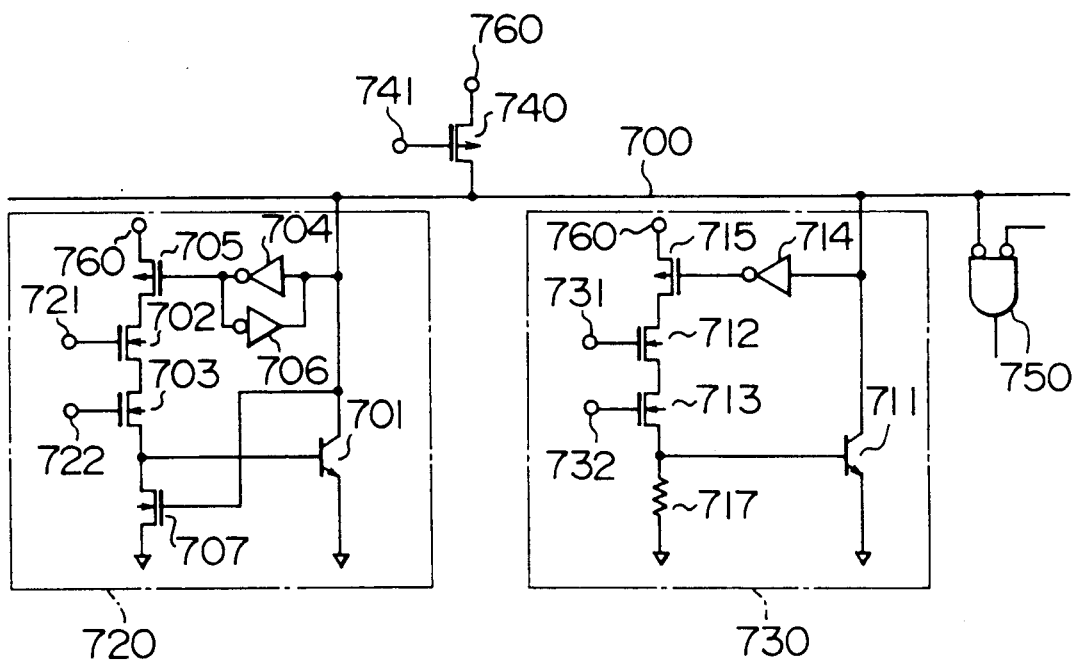
FIG. 7 is a circuit diagram of an eighth embodiment of the present invention.

FIG. 7 shows the eighth embodiment of the present invention. In the Figure, reference numerals 720 and 730 denote two-input NAND type dynamic circuits. In the circuit 720, a numeral 701 denotes an NPN having the collector and the emitter connected with a bus 700 and the reference potential. Numeral 702 and 703 denote NMOSs connected between the drain of a PMOS 705 and the base of the NPN 701 and the gates thereof are connected with input signals 721 and 722, respectively. A numeral 704 denotes an inverter, whose input is connected with the bus 700 and whose output is connected with the gate of the PMOS 705 and the source of the PMOS 705 is connected with the power supply 760. Numeral 706 denotes an inverter connected in inverse parallel with the inverter 704. 707 is an NMOS for discharging, having the drain connected with the base of the NPN 701, the gate connected with the collector of the NPN 701 and the source connected with the reference potential. Numeral 740 denotes a PMOS for precharging, having the source connected with the power supply 760, the gate connected with a control signal 741 and the drain connected with the bus 700.

Now, a state in which the bus 700 is precharged at the level "1" is considered. At this time, the output of the inverter 704 is at the level "0" and the PMOS 705 is turned on. Further, the NMOS 707 is also turned on. In this state, when both the input signals 721 and 722 are switched so as to be at the level "1", both the NMOSs 702 and 703 are turned on. As a result, a sufficient base current flows from the power supply 760 to the NPN 701 through the PMOS 705 as well as the NMOSs 702 and 703 to turn-on the NPN 701. As a result, the bus 700 is switched rapidly from the level "1" to "0". When the bus 700 is switched to the level "0", the output of the inverter 704 is switched to the level "1" to turn off the PMOS 705 so that the base current to the NPN 701 is stopped. The inverter 706 operates so as to hold the level of the bus 700 at the same level as that of the reference potential.

The circuit 730 is a two input NAND type dynamic circuit just as the circuit 720 and the structure thereof is the same as that of the circuit 720, except that the discharging means is modified with a resistor 717 and that there is no inverter connected in inverse parallel with the inverter 714. That is, NMOSs 712 and 713 correspond to the NMOSs 702 and 703, respectively, and a PMOS 715 corresponds to the PMOS 705. Further, an inverter 714 corresponds to the inverter 704 and an NPN 711 corresponds to the NPN 701. Since the operation of the circuit 730 is same as that of the circuit 720, explanation thereof is omitted.

Further, a numeral 750 denotes a logic gate circuit, in which data of the bus 700 are inputted.

Figure 8A:
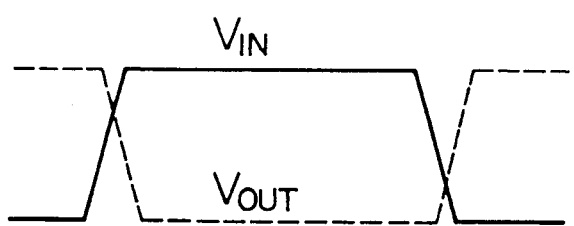
FIGS. 8A and 8B are a scheme showing output waveforms and a graph indicating delay time characteristics, respectively, of the various embodiments of the present invention.
Figure 8B:
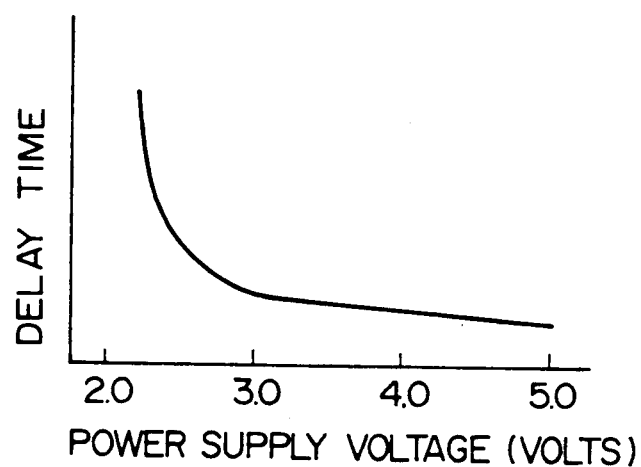
Figure 9A:
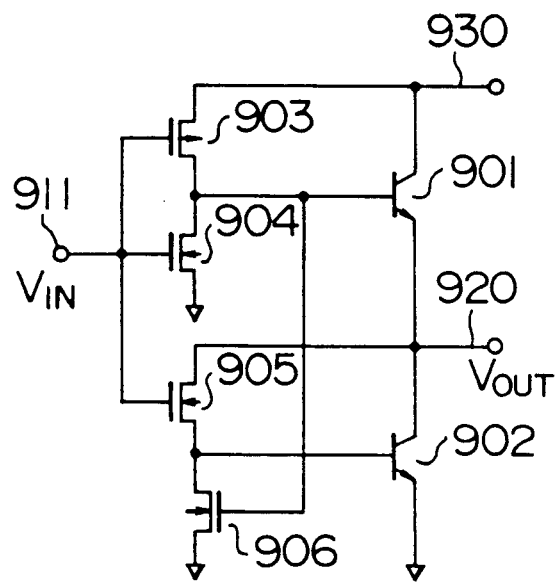
FIGS. 9A to 9C, 10, 11, 12A and 12B are diagrams for explaining the construction and the operation of prior art bipolar-CMOS logic circuits.
Figure 9B:
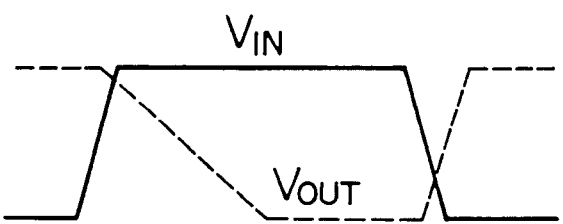
Figure 9C:
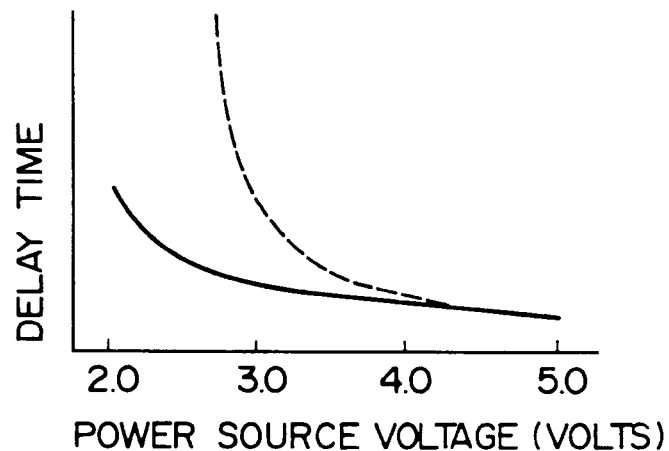
Figure 10:
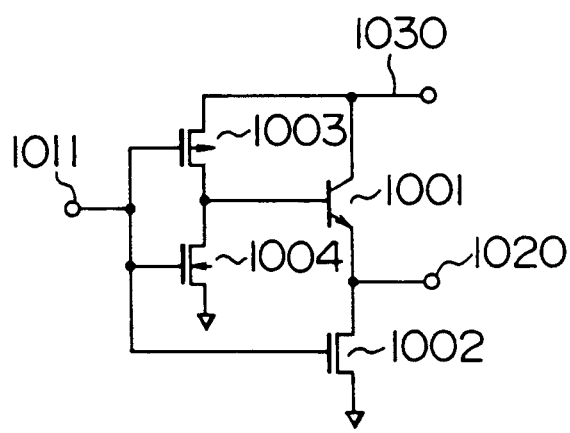
Figure 11:
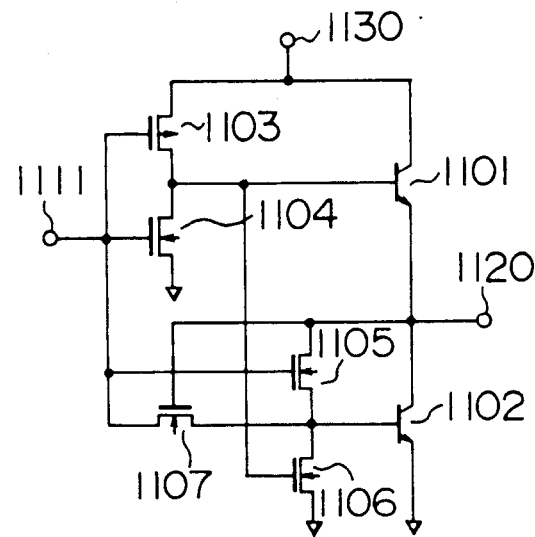
Figure 12A:
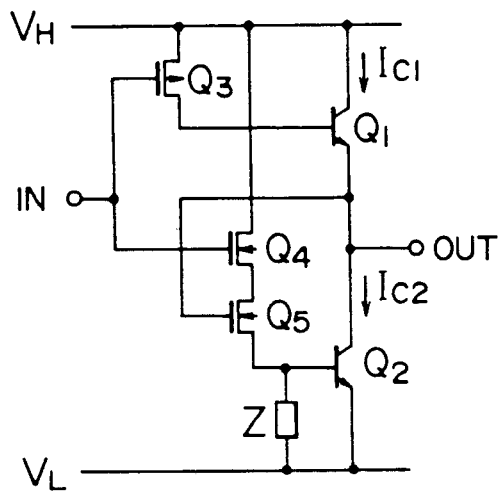
Figure 12B:
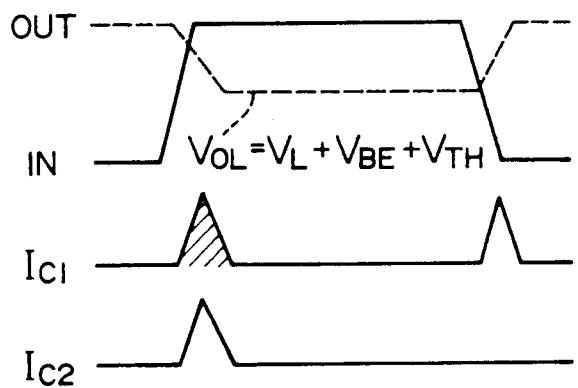

FIG. 8A shows waveforms of the input and the output $V_{OUT}$, when the embodiment described above is driven with a power supply voltage of 3 V. Contrarily to the fact that the delay increases remarkably in the fall in a prior art circuit, as indicated in FIG. 9B, according to the present invention the delay does not increase remarkably in the fall and further, as it can be seen from the FIG. 8B, it can be understood that the circuit is driven satisfactorily even with a low power supply voltage around 3 V.

As it is clear from the above explanation, since a bipolar MOS circuit according to the present invention can be driven with satisfactory characteristics even with a low supply voltage around 3 V, a high speed circuit using fine devices with an interval smaller than 0.5 μm between two adjacent conductors can be realized. Further, by using LSIs according to the present invention it is possible to intend to lower power consumption corresponding to lowering in the power source voltage.

We claim:

1. A bipolar-MOS logic circuit comprising:
   a first NPN bipolar transistor having a collector connected to a first potential terminal and an emitter connected with an output terminal of said circuit;
   a second NPN bipolar transistor having a collector connected to said output terminal and an emitter connected to a second potential terminal;
   logic inverting means having an input connected to one of the emitter and base of said first NPN transistor;
   a CMOS logic circuit having an output connected to the base of said first NPN transistor and an input to which an input signal is applied;
   a first P channel MOS transistor having a source connected to said first potential terminal and a gate connected to the output of said logic inverting means;
   an NMOS logic circuit connected between the drain of said first P channel MOS transistor and the base of said second NPN transistor; and
   discharging means connected between the base of said second NPN transistor and said second potential terminal.

2. A bipolar-MOS logic circuit according to claim 1, wherein both said CMOS logic circuit and said NMOS logic circuit are logic circuits having a same logic function with k inputs, k being an integer and k≧1.

3. A bipolar-MOS logic circuit according to claim 1, further comprising a second P channel MOS transistor having a source connected with said output terminal, a gate connected with the output of said CMOS logic circuit and a drain connected with the base of said second NPN bipolar transistor.

4. A bipolar-MOS logic circuit including a plurality of bipolar-MOS logic circuits according to claim 1 to provide a wired logic function by connecting the respective output terminals of said plurality of logic circuits in common.

5. A bipolar-MOS logic circuit according to claim 4, wherein at least one of said plurality of logic circuit further comprises another logic inverting means having an input connected with the output of said logic inverting means and an output connected with the input of said logic inverting means.

6. A bipolar-MOS logic circuit comprising:
   a first NPN bipolar transistor having the collector thereof connected with a first potential terminal and the emitter thereof connected with an output terminal of said circuit;
   a second NPN bipolar transistor having the collector thereof connected with said output terminal and the emitter thereof connected with a second potential terminal;
   logic converting means having an input connected with one of the emitter and base of said first NPN transistor;
   a CMOS logic circuit having k inputs, k being an integer and k≧1, said CMOS logic circuit having an output connected with the base of said first NPN bipolar transistor and a gate, to which an input signal is applied;
   a first P channel MOS transistor having the source thereof connected with said first potential terminal and the gate thereof connected with an output of said logic inverting means; and
   an NMOS logic circuit connected between the drain of said P channel MOS transistor and the base of said second NPN bipolar transistor.

7. A bipolar-MOS logic circuit according to claim 6, further comprising a second P channel MOS transistor having the source thereof connected with said output terminal, the gate thereof connected with the output of said CMOS logic circuit and the drain thereof connected with the base of said second NPN bipolar transistor.

8. A bipolar-MOS logic circuit including a plurality of bipolar-MOS logic circuits according to claim 6 to provide a wired logic function by connecting the respective output terminals of said plurality of logic circuits in common.

9. A bipolar-MOS logic circuit according to claim 8, wherein at least one of said plurality of logic circuits further comprises another logic inverting means having an input connected with the output of said logic inverting means and an output connected with the input of said logic inverting means.

10. A bipolar-MOS logic circuit comprising:
    a first NPN bipolar transistor having the collector thereof connected with a first potential terminal and the emitter thereof connected with an output terminal of said logic circuit;
    a second NPN bipolar transistor having the collector thereof connected with said output terminal and the emitter thereof connected with a second potential terminal;
    a CMOS logic circuit supplying an output of either a logic level "0" or logic level "1" to the base of said first NPN bipolar transistor, in response to k inputs, wherein k is an integer and k≧1;
    first current switching means including a P channel MOS transistor connected with said first potential terminal, which is conductive when the output of the CMOS logic circuit is at the logic level "1" and is cutoff when it is at the logic level "0"; and
    second current switching means including at least one N channel MOS transistor connected in series with said first switching means, which is cutoff when the output of the CMOS logic circuit is at the logic level "1" and which is conductive when it is at the logic level "0".

wherein a current is supplied to the base of said second NPN bipolar transistor from said first potential terminal through said first and second current switching means only in a transition state where the level of said output terminal changes from the logic level "1" to the logic level "0".

11. A bipolar-MOS logic circuit according to claim 10, further comprising a second P channel MOS transistor having the source thereof connected with said output, the gate thereof connected with the output of said CMOS logic circuit and the drain thereof connected with the base of said second NPN bipolar transistor.

12. A bipolar-MOS logic circuit including a plurality of bipolar-MOS logic circuits according to claim 10 to provide a wired logic function by connecting the respective output terminals of said plurality of logic circuits in common.

13. A bipolar-MOS logic circuit according to claim 12, wherein at least one of said plurality of logic circuits further comprises another logic inverting means having an input connected with the output of said logic inverting means and an output connected with the input of said logic inverting means.

14. A bipolar-MOS logic circuit comprising:
an NPN bipolar transistor having the collector thereof connected with an output bus;
logic inverting means having an input connected with the collector of said NPN bipolar transistor;
a P channel MOS transistor having the source thereof connected to receive a first potential and the gate thereof connected with an output of said logic inverting means, wherein the emitter of said NPN bipolar transistor is biased at a second potential;
an NMOS logic circuit connected between the drain of said P channel MOS transistor and the base of said NPN bipolar transistor and having k inputs, where k is an integer and k≧1, at respective gates thereof to which input signals are applied; and
discharging means connected between the base of said NPN bipolar transistor and a terminal for said second potential.

15. A bipolar-MOS logic circuit according to claim 14, further comprising another logic inverting means having an input connected with the output of said logic inverting means and an output connected with the input of said logic inverting means.

16. A bipolar-MOS logic circuit according to claim 14, wherein said discharging means is comprised of an N channel MOS transistor having the drain thereof connected with the base of said NPN bipolar transistor, the gate thereof connected with the collector said NPN bipolar transistor and the source thereof connected with the terminal for said second potential.

17. A bipolar-MOS transistor device comprising:
an NPN bipolar transistor having a collector connected with an output bus and an emitter;
a P channel MOS transistor, one end of the channel of which is connected to receive a first potential and which is turned on when said output bus is at a logic level "1" and turned off when it is at a logic level "0", wherein the emitter of said NPN bipolar transistor is biased at a second potential; and
an NMOS logic circuit having k inputs where k is an integer and k≧1, one end of the channel of which is connected with the other end of said P channel MOS transistor and having a gate in which an input signal is applied; the other end of the channel of said NMOS logic circuit being connected with the base of said NPN bipolar transistor,
whereby a base current is supplied to the base of said NPN bipolar transistor from said first potential through said P channel MOS transistor and said NMOS logic circuit in response to signals of said k inputs when said P channel MOS transistor is turned on.

18. A bipolar-CMOS semiconductor integrated circuit having k input terminals where k is an integer and k ≧ 1, a first potential terminal, a second potential terminal and an output terminal, comprising:
a first NPN bipolar transistor having the collector thereof connected with said first potential terminal and the emitter thereof connected with said output terminal;
a second NPN bipolar transistor having the collector thereof connected with said output terminal and the emitter thereof connected with said second potential terminal;
a CMOS logic circuit having gate inputs respectively connected with said k input terminals and having an output connected with the base of said first NPN bipolar transistor; and
current path establishing means including a PMOS switch and an NMOS switch connected in series from said first potential terminal to the base of said second NPN bipolar transistor for supplying a current from said first potential terminal to the base of said second NPN bipolar transistor only in a logic level transition state where the level of said output terminal changes from the logic level "1" to the logic level "0".

19. A bipolar-MOS logic circuit comprising:
a first NPN bipolar transistor having a collector connected to receive a first potential and an emitter connected with an output terminal of said logic circuit;
a second NPN bipolar transistor having a collector connected to said output terminal and an emitter connected to receive a second potential;
a CMOS logic circuit having an output connected to the base of said first NPN bipolar transistor and an input to which an input signal is applied;
current path establishing means including a PMOS switch and an NMOS switch connected in series from a terminal where said first potential is applied to the base of said second NPN transistor, for supplying a current from the first potential terminal to the base of said second bipolar transistor only in a logic level transition state where the level of said output terminal changes from the logic level "1" to a logic level "0".

* * * * *